(12) United States Patent
Morris et al.

(10) Patent No.: US 8,728,388 B2
(45) Date of Patent: May 20, 2014

(54) METHOD OF FABRICATING TURBINE COMPONENTS FOR ENGINES

(75) Inventors: Mark C. Morris, Phoenix, AZ (US);
Tom Strangman, Prescott, AZ (US);
Yiping Hu, Greer, SC (US)

(73) Assignee: Honeywell International Inc., Morristown, NJ (US)

( * ) Notice: Subject to any disclaimer, the term of this patent is extended or adjusted under 35 U.S.C. 154(b) by 1201 days.

(21) Appl. No.: 12/631,285

(22) Filed: Dec. 4, 2009

(65) Prior Publication Data

US 2011/0135952 A1    Jun. 9, 2011

(51) Int. Cl.
*B22F 7/02* (2006.01)
*B23K 26/00* (2014.01)
*B22F 5/04* (2006.01)

(52) U.S. Cl.
USPC .............. 419/6; 419/26; 419/29; 219/121.65; 219/121.66; 219/121.85

(58) Field of Classification Search
USPC .................. 75/6; 219/121.65, 121.66, 121.85
See application file for complete search history.

(56) References Cited

U.S. PATENT DOCUMENTS

| 4,975,124 | A | * | 12/1990 | Ault ............................... 148/562 |
| 5,047,091 | A | * | 9/1991 | Khan et al. ..................... 148/535 |
| 5,156,697 | A |   | 10/1992 | Bourell et al. |
| 5,352,405 | A | * | 10/1994 | Beaman et al. .................. 419/45 |
| 5,453,329 | A |   | 9/1995 | Everett et al. |
| 5,837,960 | A | * | 11/1998 | Lewis et al. .............. 219/121.63 |
| 6,024,792 | A | * | 2/2000 | Kurz et al. .......................... 117/9 |
| 6,103,402 | A | * | 8/2000 | Marcin et al. ................. 428/637 |
| 6,122,564 | A |   | 9/2000 | Koch et al. |
| 6,495,793 | B2 |  | 12/2002 | Tewari |
| 6,811,744 | B2 | * | 11/2004 | Keicher et al. ..................... 419/5 |
| 6,815,636 | B2 |  | 11/2004 | Chung et al. |
| 7,452,500 | B2 | * | 11/2008 | Uckelmann ........................ 419/6 |
| 7,521,017 | B2 |  | 4/2009 | Kunze et al. |
| 7,586,061 | B2 |  | 9/2009 | Hoebel et al. |
| 2008/0135530 | A1 | | 6/2008 | Lee et al. |
| 2009/0206065 | A1 | | 8/2009 | Kruth et al. |

* cited by examiner

*Primary Examiner* — George Wyszomierski
*Assistant Examiner* — Ngoclan T Mai
(74) *Attorney, Agent, or Firm* — Ingrassia Fisher & Lorenz, P.C.

(57) ABSTRACT

A method is provided that includes depositing metal powder over a seed crystal having a predetermined primary orientation, scanning an initial pattern into the metal powder to melt or sinter the deposited metal powder, and re-scanning the initial pattern to re-melt the scanned metal powder and form an initial layer having the predetermined primary orientation. The method further includes depositing additional metal powder over the initial layer, scanning an additional pattern into the additional metal powder to melt or sinter at least a portion of the additional metal powder, re-scanning the additional pattern to re-melt a portion of the initial layer and the scanned deposited additional metal powder to form a successive layer having the predetermined primary orientation, and repeating the steps of depositing additional metal powder, scanning the additional pattern, and re-scanning the additional pattern, until a final shape of the component is achieved.

11 Claims, 4 Drawing Sheets

METHOD OF FABRICATING TURBINE COMPONENTS FOR ENGINES

TECHNICAL FIELD

The inventive subject matter generally relates to engines, and more particularly relates to turbine components for engines and methods of fabricating the turbine components.

BACKGROUND

Turbine engines are used as the primary power source for various kinds of aircraft. The engines may also serve as auxiliary power sources that drive air compressors, hydraulic pumps, and industrial electrical power generators. Most turbine engines generally follow the same basic power generation procedure. Compressed air is mixed with fuel and burned, and the expanding hot combustion gases are directed against stationary turbine vanes in the engine. The vanes turn the high velocity gas flow partially sideways to impinge onto turbine blades mounted on a rotatable turbine disk. The force of the impinging gas causes the turbine disk to spin at high speed. Jet propulsion engines use the power created by the rotating turbine disk to draw more air into the engine, and the high velocity combustion gas is passed out of the gas turbine aft end to create forward thrust. Other engines use this power to turn one or more propellers, electrical generators or other devices.

Turbine engines, such as the one described above, typically operate more efficiently at increasingly higher temperatures. Some turbine engine components, such as turbine blades and disks, may experience greater degradation at higher temperatures. In some cases, the engine components may be made of a single crystal composition, and/or another composition, which may be better suited for higher temperatures. However, gas turbine disks fabricated using individually cast and inserted single crystal airfoils tend to be expensive. Additionally, a fabrication period for these components may take several months, which may be undesirable because component designs may be modified for performance improvement at some point during the fabrication period.

Accordingly, it is desirable to have an improved method of fabricating turbine engine components. In addition, it is desirable for the method to be relatively inexpensive and simple to perform. Moreover, it is desirable to have a reduced lead time for fabricating turbine engine components. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Methods of fabricating a component having a directionally solidified microstructure or a single crystal microstructure and components for engines are provided.

In an embodiment, by way of example only, a method includes depositing metal powder over a seed crystal, the seed crystal having a predetermined primary orientation, scanning an initial pattern into the deposited metal powder with a laser beam to at least partially melt or sinter at least a portion of the deposited metal powder, and re-scanning the initial pattern with the laser beam to re-melt the scanned metal powder and form an initial layer, the initial layer having the predetermined primary orientation. The method further includes depositing additional metal powder over the initial layer, scanning an additional pattern with the laser beam into the deposited additional metal powder to at least partially melt or sinter at least a portion of the deposited additional metal powder, re-scanning the additional pattern with the laser beam to re-melt a portion of the initial layer and the scanned deposited additional metal powder to form a successive layer, the successive layer having the predetermined primary orientation, and repeating the steps of depositing additional metal powder, scanning the additional pattern, and re-scanning the additional pattern, until a final shape of the component is achieved.

In another embodiment, by way of example only, a method includes depositing metal powder over a seed crystal, the seed crystal having a predetermined primary orientation and a predetermined secondary orientation, scanning an initial pattern into the deposited metal powder with a laser beam to melt or sinter at least a portion of the deposited metal powder, and re-scanning the initial pattern with the laser beam to re-melt the scanned metal powder and at least a portion of the seed crystal to form an initial layer, the initial layer having the predetermined primary orientation and the predetermined secondary orientation. The method also includes depositing additional metal powder over the initial layer, scanning an additional pattern with the laser beam into the deposited additional metal powder to melt or sinter at least a portion of the deposited additional metal powder, re-scanning the additional pattern with the laser beam to re-melt a portion of the initial layer and the scanned deposited additional metal powder to form a successive layer, the successive layer having the predetermined primary orientation and the predetermined secondary orientation, and repeating the steps of depositing additional metal powder, scanning the additional pattern, and re-scanning the additional pattern, until a final shape of the turbine component is achieved.

In still another embodiment, by way of example only, a component includes a seed crystal having a first predetermined orientation, a first portion of the component formed on the seed crystal from laser sintered metal powder, the first portion having the first predetermined orientation, and a second portion of the component formed on the first portion from laser sintered metal powder, the second portion having the first predetermined orientation.

BRIEF DESCRIPTION OF THE DRAWINGS

The inventive subject matter will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter.

Furthermore, there is no intention to be bound by any theory presented in the preceding background or the following detailed description.

Generally, the inventive subject matter relates to improved methods for manufacturing single crystal microstructure components or directionally solidified microstructure components. The method includes depositing a relatively thin layer of metal powder over a seed crystal having a predetermined primary orientation, scanning an initial pattern into the thin layer of metal powder with a laser beam to sinter or melt the metal powder in the initial pattern and adhere the metal powder to the seed crystal, raising a surface on which the scanning occurred ("scan surface") above a surface of a powder bed, and re-scanning the initial pattern with the laser beam to substantially melt the previously-scanned metal powder and to melt a portion of the seed crystal, where the portion of the melted seed crystal may include a depth of several microns, to thereby form an initially-deposited layer with an epitaxial structure. By raising the scanned surface out of the powder bed, the possibility of adhering new, unmelted powder particles into the solidified layer is minimized During solidification, the initially-deposited layer acquires its crystallographic texture from the seed crystal. The scan surface is lowered below the surface of the powder bed and a new, additional layer of powder is deposited. The additional metal powder is sinter-scanned, raised above the powder bed, and substantially, fully melted (to include a few microns penetration into the initially-deposited layer) to form a successive layer having the predetermined primary crystallographic orientation. The process is repeated until a final shape of the component is achieved. In other embodiments, the seed crystal may have the predetermined primary orientation and a predetermined secondary orientation, and the steps of depositing, sinter-scanning, and full-melt scanning may form one or more successive layers having the predetermined primary orientation and the predetermined secondary orientation.

Figure 1:
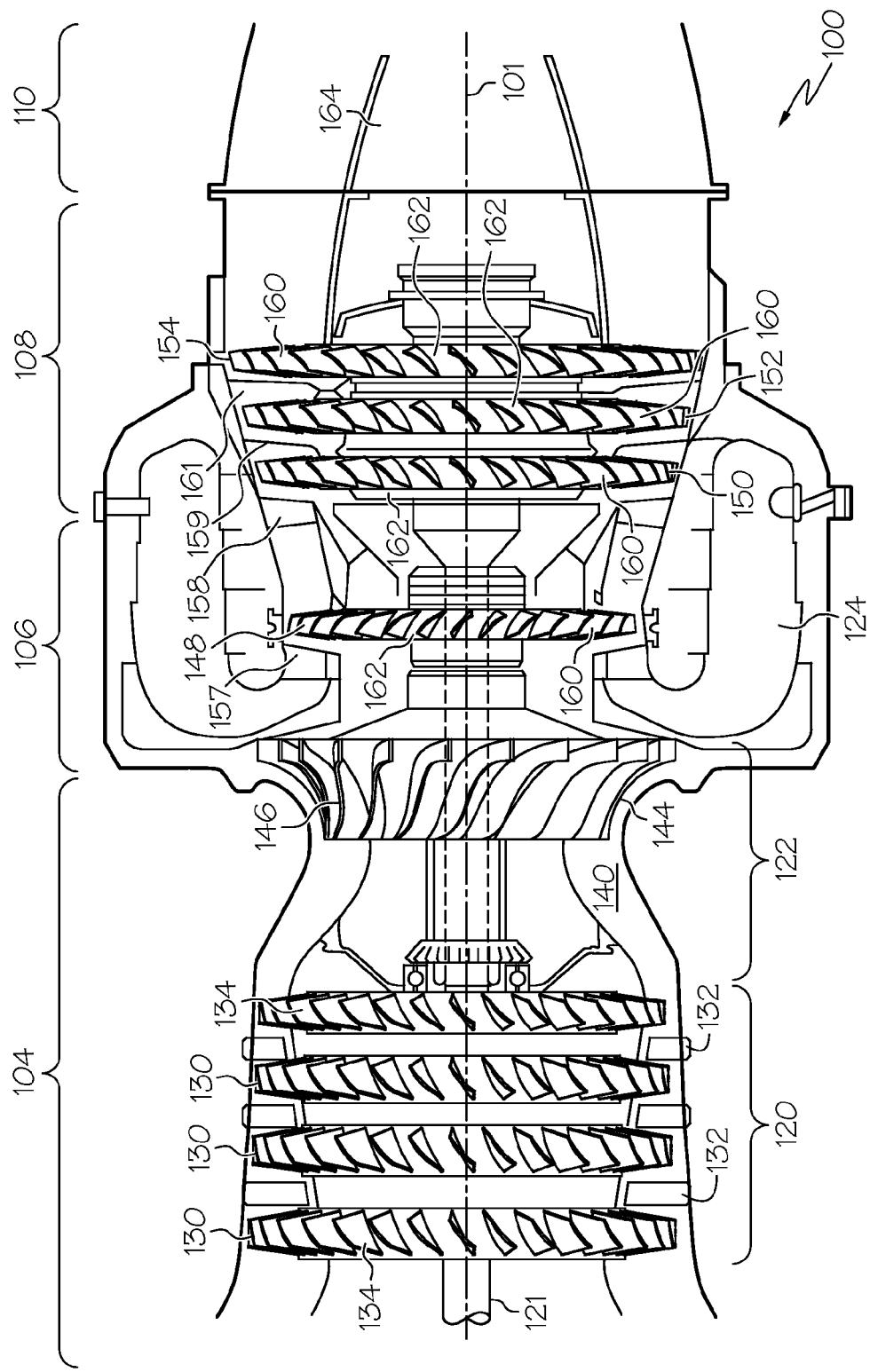
FIG. 1 is a close up, cross section side view of a compressor section, a combustor section, a turbine section, and an exhaust section of a turbofan gas turbine engine, according to an embodiment.

An example of a system in which single crystal or directionally solidified microstructure components are included is depicted in FIG. 1. FIG. 1 is a close up, cross section side view of a compressor section 104, a combustor section 106, a turbine section 108, and an exhaust section 110 of a turbofan gas turbine engine 100, according to an embodiment. The turbofan gas turbine engine 100 may include a fan (not shown), which draws air into an intake section (not shown) and accelerates it. A fraction of the accelerated air exhausted from the fan is used to provide a forward thrust, while a remaining fraction of air exhausted from the fan is directed into the compressor section 104.

The compressor section 104 includes two compressor stages: an intermediate pressure compressor 120 and a high pressure compressor 122 interconnected by a rotary shaft 121 along an engine centerline 101, and a secondary cooling airflow system. In an embodiment, the rotary shaft 121 interconnects the intermediate pressure compressor 120 and the high pressure compressor 122 in torque transmitting relationship. According to an embodiment, the intermediate pressure compressor 120 raises the pressure of the air directed into it from the fan (not illustrated), and directs the compressed air into the high pressure compressor 122. The intermediate pressure compressor 120 includes multiple stages, each including a rotor 130 and a stator 132. Each of the rotors 130 has a plurality of rotor blades 134, in an embodiment. As the rotors 130 rotate, the plurality of rotor blades 134 force air through each of the stators 132 in a subsequent stage.

The high pressure compressor 122 may include a high pressure diffuser case 140 and a rotationally mounted high pressure impeller 144. The high pressure diffuser case 140 couples the intermediate pressure compressor 120 to the high pressure compressor 122 and directs exhausted air into the high pressure impeller 144. The high pressure impeller 144 has a plurality of vanes 146 extending therefrom that accelerate and compress the air. The high pressure impeller 144 compresses the air still further, and directs the high pressure air into the combustion section 106.

In the combustion section 106, which includes a combustor 124, the high pressure air is mixed with fuel and combusted. The combustor 124 receives the high pressure air from the compressor section 104 and mixes it with fuel to generate combusted air. The combusted air is then directed into the turbine section 108.

In an embodiment, the turbine section 108 includes a single-stage high pressure turbine 148 and a three stage low pressure turbine 150, 152, 154 disposed in axial series. Propulsion gas turbine engines may comprise only a high pressure turbine and a low pressure turbine. The expanding combusted air from the combustion section 106 expands through each turbine, causing it to rotate. More specifically, the hot combustion gases generated by the combustor 124 are directed against the stationary turbine nozzles and vanes 157, 158, 159, 161. The stationary turbine nozzles and vanes 157, 158, 159, 161 turn the high velocity gas flow partially sideways to impinge on a plurality of turbine blades 160 mounted on rotatable turbine disks 162 in each of the turbines 148, 150, 152 and 154. The force of the impinging gas causes the rotatable turbine disks 162 to spin at high speed. The air is then exhausted through a propulsion nozzle 164 disposed in the exhaust section 110, providing additional forward thrust. As the turbines 148, 150, 152 and 154 rotate, each drives equipment in the engine 100 via concentrically disposed shafts or spools.

Figure 2:
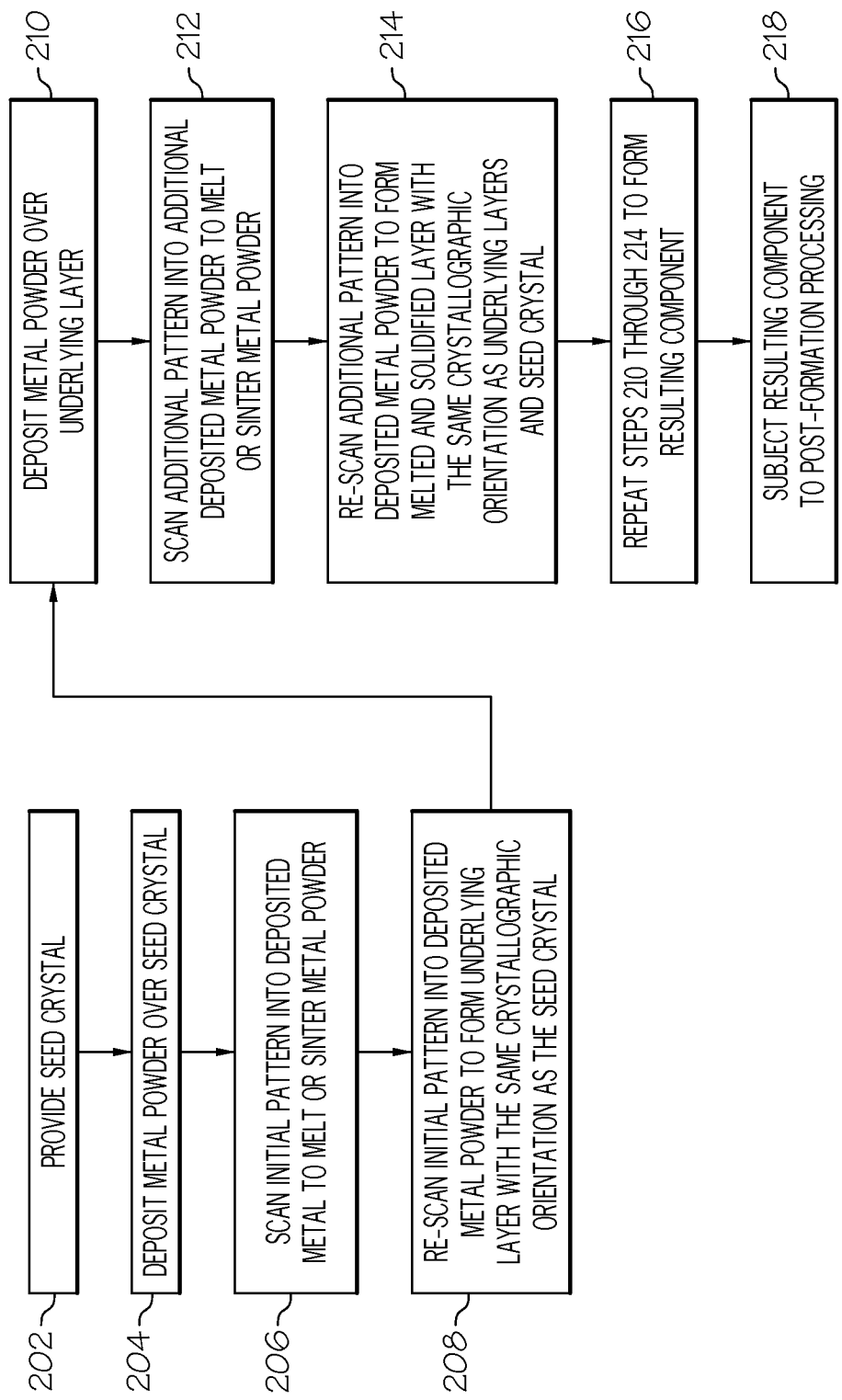
FIG. 2 is a flow diagram of a method for manufacturing components having directionally solidified or single crystal microstructures, according to an embodiment.

To provide components of the engine 100, such as the turbine nozzles and vanes 157, 158, 159, 161 or turbine blades 160, with optimized mechanical properties when subjected to high temperatures and pressures during engine operation, the components may be formed with directionally solidified microstructures or single crystal microstructures. FIG. 2 is a flow diagram of a method 200 for manufacturing the components having directionally solidified or single crystal microstructures, according to an embodiment. In an embodiment, a seed crystal is provided having at least a predetermined primary orientation, step 202. For example, seed crystals employed for producing a directionally solidified and single crystal microstructures may have at least the predetermined primary orientation. Seed crystals intended for use in forming single crystal microstructures may also include a predetermined secondary orientation.

As used herein, the term "predetermined primary orientation" may be defined as a direction perpendicular to a crystal lattice plane of the seed crystal. In an embodiment, the predetermined primary orientation in a nickel-base superalloy seed crystal may be denoted as a [001] direction. In an embodiment, the desired orientation may be in a direction that provides a component with improved creep strength. The particular growth direction may be selected based on a desired orientation of the component. For example, in embodiments in which the component is a blade including an airfoil extending from an attachment section, the airfoil may extend along a first axis, which may be disposed in a first primary axis direction. Hence, when the airfoil is grown from the seed crystal, growth may occur in a [001] direction substantially parallel to the first primary axis.

The term "predetermined secondary orientation" may be defined as a second direction of a crystal lattice of the seed crystal. The predetermined secondary crystallographic orientation may be denoted as a [100] direction, which is orthogonal to the crystallographic direction. The attachment section of the turbine blade may be orthogonal to the axis of the blade airfoil along a second primary axis of the seed crystal lattice. Thus, orientation of the attachment section may occur in a [100] direction which may provide improved creep and fatigue strength properties of the component.

Although the predetermined primary and secondary orientations are depicted as a direction and a [100] direction respectively, a [100] direction may represent the predetermined primary orientation or a [001] direction may represent the predetermined secondary orientation, in other embodiments. In still other embodiments, either the predetermined primary or secondary orientation may alternatively be represented by a [010] third primary axis direction, which may represent a direction that is substantially parallel with a third axis that is orthogonal to the first and the second axes.

In an embodiment, the seed crystal may comprise a superalloy or alloy material that may be conventionally employed for manufacturing engine components and may be selected based on desired strength capabilities of the component. For example, in embodiments in which the component is fabricated as having a multi-grained directionally solidified microstructure, superalloys including grain boundary strengthening elements, such as hafnium, carbon or boron, may be employed. Examples of such superalloys include, but are not limited to CMSX-486 and MAR-M-247. In embodiments in which the component is fabricated as having a single crystal microstructure, alloys such as SC180, CMSX3, CMSX4, and CMSX486 may be used.

Figure 3:
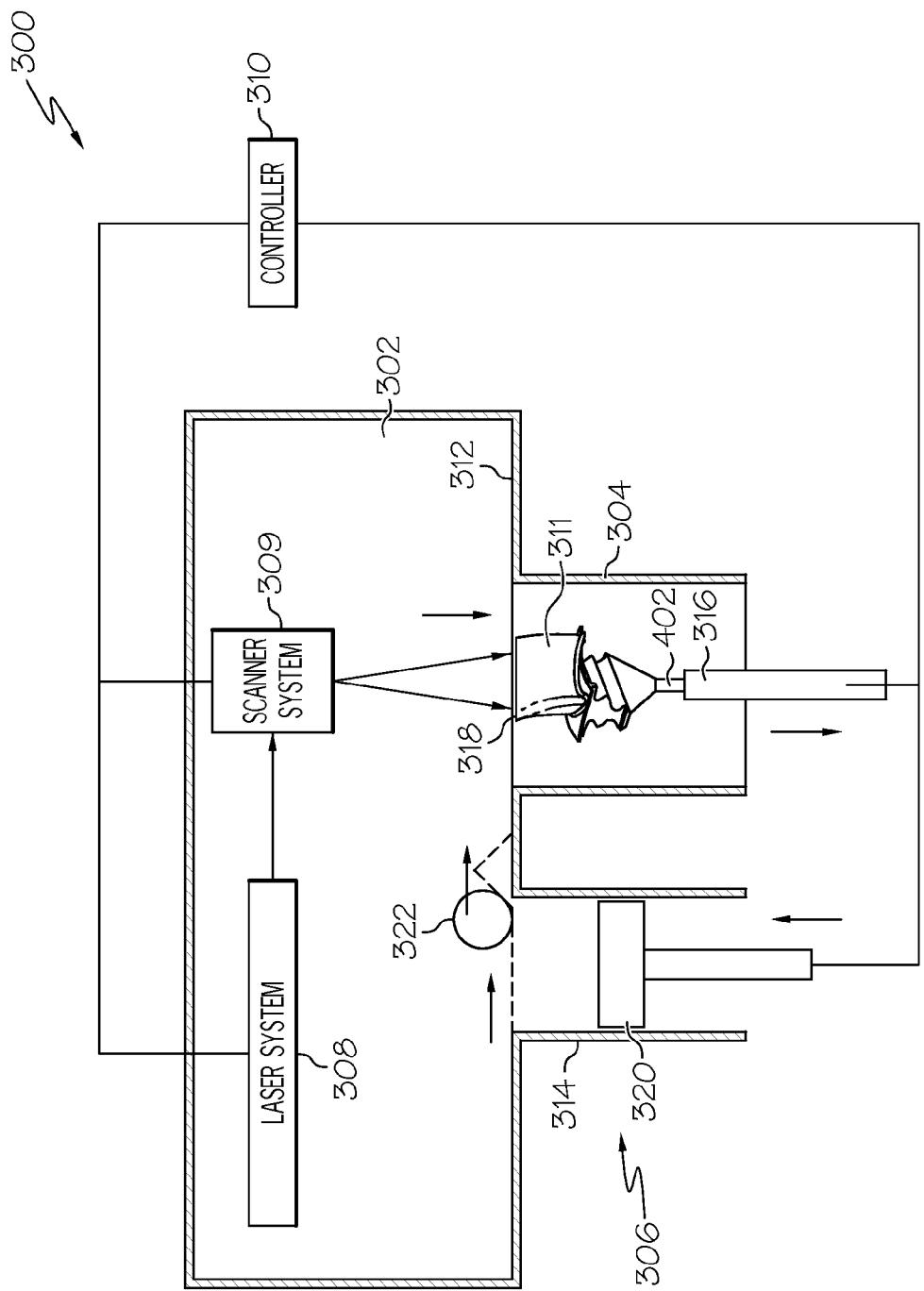
FIG. 3 is a simplified schematic of a direct laser metal sintering system, according to an embodiment.

To manufacture a component, the seed crystal may be disposed in a direct laser metal sintering system. FIG. 3 is a simplified schematic of a direct laser metal sintering system 300, according to an embodiment. The system 300 may include a chamber 302, a fabrication well 304, a powder delivery system 306, a laser system 308, a scanner system 309, and a controller 310. In an embodiment, the chamber 302 is configured to be maintained at a particular temperature and atmosphere for laser metal sintering/melting of a component 311. The chamber 302 may have a floor 312 including openings into the fabrication well 304 and a powder source container 314. In an embodiment, the fabrication well 304 and the powder source container 314 are disposed below the floor 312. In other embodiments, the fabrication well 304 alternatively may be disposed adjacent to or in another location relative to the floor 312.

Figure 4:
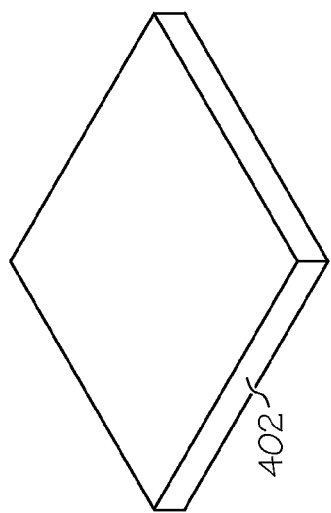

The fabrication well 304 may be filled with powder and may include a piston 316 that supports the seed crystal and the component 311. The support piston 316 is configured to support a seed crystal and to receive metal powder that defines a target surface 318 of the component 311. For example, FIG. 4 illustrates a seed crystal 402, in accordance with an embodiment, which may be used as a foundation for manufacturing a component. A motor (not shown) may control the support piston 316 to move the support piston 316 (and hence, the target surface 318) vertically through the container well 304 relative to the floor 312 of the chamber 302. According to an embodiment, the motor is operatively coupled to the controller 310, which provides commands to the motor to move the support piston 316 predetermined distances downward relative to the floor 312 of the chamber 302 to thereby define a thickness of a layer of metal powder to be processed. The support piston 316 may also move the scanned surface of the component above the floor 312 of the chamber 302 to facilitate the full-melt scan of the deposited layer on the target surface 318.

The powder delivery system 306 is configured to deliver metal powder to the fabrication well 304. As alluded to briefly above, the powder delivery system 306 may comprise the powder source container 314 within which metal powder may be disposed. According to an embodiment, the container 314 may include a powder delivery piston 320 configured to move upwardly relative to the floor 312 of the chamber 302 so that, when the container 314 includes metal powder, a volume of the metal powder is lifted out of the container 314 and the opening in the floor 312. Although the opening is depicted as being on a top portion of the container 314 and the floor 312 of the chamber 302, the opening alternatively may be formed on a side wall or a bottom wall defining the chamber 302. In such case, a valve may be included in the opening to control a rate and/or amount of metal powder provided to the fabrication well 304.

The delivery mechanism 322 is configured to be capable of moving a desired quantity of the metal powder into the fabrication well 304. In an embodiment, the delivery mechanism 322 may comprise a roller configured to transfer powder from the powder delivery system 306 to the fabrication well 304. Thus, after a volume of metal powder is lifted out of the container 314, the delivery mechanism 322 moves the volume of metal powder along the floor 312 of the chamber 302 and over the support piston 316 to replenish the target surface 318 with additional metal powder. Although shown as a roller, in other embodiments, the delivery mechanism 322 may be a scoop, screed, or other device capable of transporting metal powder from one area to another. In another embodiment in which the opening in the powder source container is formed on the side wall or bottom wall, the delivery mechanism 322 may comprise a delivery line or another mechanism capable of transferring metal powder from one area to another.

The laser system 308 is configured to generate a laser beam. In an embodiment, the laser system 308 may be configured to provide a laser beam having power in a range of about 50 to about 500 watts. In another embodiment, the laser beam may be configured to produce a laser spot having a diameter in a range of about 0.15 mm (millimeters) to about 1.0 mm. The laser beam may be provided at a wavelength in a range of about 1.06 microns. In another embodiment, the laser beam may be provided with solid state lasers such as Nd:YAG laser and Ytterbium fiber laser. The scanner system 309 directs the laser beam at the target surface 318. In this regard, the scanner system 309 employs one or more reflective surfaces (e.g., mirrors) and/or optical devices (e.g., lenses and/or prisms) which deflect the laser beam to desired locations on the target surface 318. In an embodiment, the desired locations may be determined by a predetermined pattern corresponding to a cross-section of the component.

The controller 310 communicates with the motors of the support piston 316, the powder delivery piston 320, the laser system 308, the scanner system 309, and/or other components of the direct laser metal sintering system 300. In an embodiment, the controller 310 may be programmed to provide commands to the powder delivery system 306 to deliver a predetermined amount of metal powder to the fabrication well 304 and/or to move the support piston 316 (and its attached laser-deposited component 311) a particular depth to create a space for receiving the metal powder. In another embodiment, the controller 310 provides commands to the laser system 308 to provide a laser beam having a particular laser output power and a laser spot diameter at a target surface. The controller 310 may further provide commands to the scanner system 300 to deflect the laser along a path in the shape of the predetermined pattern on the target surface of the powder bed.

Returning again to FIG. 2, metal powder is deposited over the seed crystal, step 204. For example, a volume of metal powder in a powder source container (e.g., powder source container 314 of FIG. 3) may be raised upward relative to a floor (e.g., floor 312 of FIG. 3) of the chamber (e.g., chamber 302 of FIG. 3) and a portion of the metal powder may be conveyed across the floor by a delivery mechanism (e.g., mechanism 322 of FIG. 3). The portion of metal powder may be deposited into a fabrication well (e.g., well 304 of FIG. 3) over the seed crystal. In an embodiment, the portion of metal powder also surrounds the seed crystal to form a layer of a powder bed. In accordance with an embodiment, a thickness of the layer of metal powder may be in a range of about 15 microns to about 50 microns. In other embodiments, the thickness of the metal powder layer may be greater or less than the aforementioned range.

The metal powder may comprise a superalloy or alloy having a composition that is substantially similar or identical (e.g., >99%) to that of the seed crystal, in an embodiment. For example, the metal powder may comprise one of the superalloys mentioned above in relation to the seed crystal. According to an embodiment, the metal powder may comprise particles having an average diameter in a range of about 5 microns to about 50 microns. In other embodiments, the particle diameters may be larger or smaller than the aforementioned range.

Figure 5:
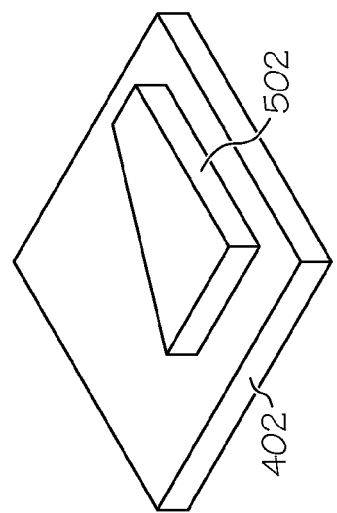

Next, an initial pattern is scanned into the deposited metal powder with a laser beam to sinter or melt at least a portion of the metal powder, step 206. The initial pattern may be a pattern corresponding to a cross section of the component to be fabricated. For example, the cross section of the component may lie in a horizontal plane through the component. In other embodiments, the cross section may be taken along a different plane through the component. To scan the initial pattern into the deposited metal powder, a laser system provides the laser beam and a scanner system deflects the laser beam to thereby move the laser beam across the target surface of the layer of metal powder along a path corresponding to the initial pattern. According to an embodiment, the laser is provided with a first set of modulation parameters suitable for energizing and sintering or melting the metal powder. The modulation parameters may include laser power parameters, laser spot diameter settings, laser wavelength settings, and scan speed. The laser beam may scan across the metal powder layer in a raster-scan fashion, a vector fashion, a zig-zag fashion or a combination of scan fashions. As used herein, the term "raster-scan fashion" may be defined as generally horizontal and vertical patterns. As used herein, the term "vector fashion" may be defined as a pattern which generally follows directions parallel or orthogonal to features of the component. As used herein, the term "zig-zag fashion" may be defined as a pattern which proceeds in a general direction by utilizing many alternating sharp bends or turns. When the sintered or melted metal powder cools and solidifies, a portion of the component is formed. For example, FIG. 5 illustrates a portion 502 of a component formed on the seed crystal 402 of FIG. 4, in accordance with an example embodiment.

The initial pattern is re-scanned across the layer of metal powder with the laser beam to re-melt the scanned deposited metal powder and a few microns of the substrate to form an "initial layer", step 208. In an embodiment, the scanned deposited metal powder is fully (e.g. >99%) re-melted. In another embodiment, a scan surface, which includes the scanned deposited metal powder, may be re-positioned above the floor of the chamber. For example, the support piston may move vertically through the fabrication well to move the deposited metal powder above the powder bed. In this way, the deposited metal powder is separated from the powder bed and full melting of the deposited metal powder may be isolated from the unconsolidated metal powder in chamber 304.

The laser system is set at a second set of modulation parameters, before re-scanning occurs at the target surface. The second set of modulation parameters may include one or more modulation parameters that are different from those of the first set of modulation parameters. For example, the second set of modulation parameters may include a laser power that is greater than the laser power of the first set of modulation parameters. In one example, the laser power of the first set of modulation parameters may be in a range of about 50 watts to about 300 watts, and the laser power provided for the second set of modulation parameters may be in a range of about 100 watts to about 500 watts. In another embodiment, the second set of modulation parameters additionally or alternatively may include a laser focal size or scan speed that is different from that of the first set of modulation parameters.

In any case, re-scanning the initial pattern to re-melt the deposited powder allows the deposited metal powder to acquire the crystallographic orientation of the seed crystal. Accordingly, for directionally solidified configurations, the initial layer comprises a plurality of grains that are arranged in crystal structures having the predetermined primary orientation [001]. The desired primary orientation is obtained by positioning the seed crystal in the predetermined primary orientation. In another embodiment, for single crystal applications the initial layer comprises a single grain having the predetermined primary orientation. In an embodiment, the predetermined primary orientation is [001]. The desired primary orientation is obtained by positioning the seed crystal in the predetermined primary orientation. In still yet another embodiment, for single crystal applications with desired primary and secondary crystal orientation control, the initial layer comprises a single grain having the predetermined primary orientation and predetermined secondary orientation, where the desired secondary orientation is obtained by positioning the seed crystal in the predetermined primary orientation and predetermined secondary orientation.

After the initial layer is formed, additional metal powder is deposited over the initial layer, step 210. For example, a volume of metal powder in the powder source container may be raised upward relative to the floor of the chamber and a portion of the metal powder may be translated across the floor by the delivery mechanism. The portion of metal powder may be deposited into the fabrication well over the initial layer. In an embodiment, the portion of metal powder also surrounds the initial layer to form another layer of the powder bed. In accordance with an embodiment, a thickness of the layer of additional metal powder may be in a range of about 15 microns to about 50 microns. In other embodiments, the thickness of the additional metal powder layer may be greater or less than the aforementioned range.

An additional pattern is then scanned with the laser beam into the deposited additional metal powder to melt or sinter at least a portion of the additional metal powder, step 212. The additional metal powder metallurgically bonds to the previously deposited layer. The additional pattern may be a pattern corresponding to a cross section of the component to be fabricated that is immediately adjacent to the cross section of the component corresponding to the initial pattern. In this regard, in some embodiments, the additional pattern may be different from the initial pattern. In other embodiments, the additional pattern may be substantially identical to the initial pattern. In any case, the laser beam is deflected by a scanner system (e.g., scanner system 309) at locations on a target surface of the layer of additional metal powder corresponding to the additional pattern.

Figure 6:
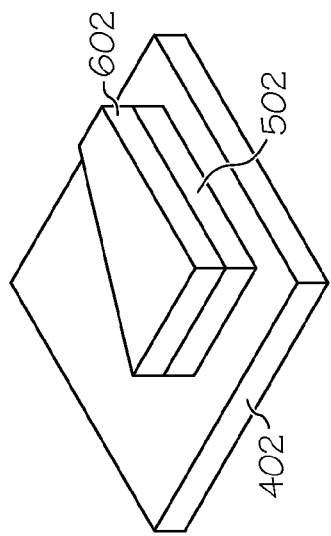
FIGS. 4-7 illustrate a component in various stages of manufacture, according to an embodiment.

The laser beam may be provided at the first set of modulation parameters in order to sinter or melt the additional metal powder. In another embodiment, a third set of modulation parameters may be employed. The third set of modulation parameters may have one or more parameters that are different from those of the first or second sets of modulation parameters. For example, the layer of deposited additional metal powder may be thinner than a previously deposited layer, and a reduced laser power may be used in the third set of modulation parameters. In another example, a different laser wavelength may be used in the third set of modulation parameters or a smaller or larger laser spot diameter may be employed. In another embodiment, the first and third sets of modulation parameters may be substantially equal to each other. The laser beam scans across the target surface in a raster-scan fashion, a vector scan fashion, a zig-zag scan fashion or a combination of scan fashions. When the melted metal powder cools and solidifies, another portion of the component is formed in the metal powder. For example, FIG. 6 illustrates a second portion 602 of a component formed on the first portion 502 and the seed crystal 402 of FIGS. 4 and 5, in accordance with an example embodiment.

Next, the additional pattern is re-scanned with the laser beam to partially re-melt at least a portion of the underlying initial layer and re-melt the scanned additional metal powder to form a successive layer, the successive layer having the predetermined primary orientation of the seed crystal and of the initial layer, step 214. In an embodiment, during re-melt, the scanned additional metal powder is fully (e.g., >99%) melted. As noted above, a successive layer configured to have a single crystal microstructure also includes the predetermined secondary orientation. According to an embodiment, the scanned additional metal powder and the initial layer may be re-positioned above a surface of the powder bed. In this way, the scanned additional metal powder and the initial layer are separated from the powder bed and melting may be isolated to the scanned additional metal powder and a portion of the initial layer.

In an embodiment, the laser system is set to a fourth set of modulation parameters, before re-scanning occurs at the target surface on the scanned additional metal powder. The fourth set of modulation parameters includes a laser power that is greater than the laser power of the third set of modulation parameters suitable for melting the scanned additional metal powder and the portion of the initial layer immediately adjacent to the scanned additional metal powder. In other embodiments, the fourth set of modulation parameters may have other parameters (e.g., laser power, laser spot diameter, laser wavelength, scan speed, etc.) that are different from or substantially equal to those of the first, second or third parameters. In any case, the fourth set of modulation parameters are provided to allow the laser beam to melt a total thickness of material in a range of about 15 microns to about 50 microns, in an embodiment. Hence, in accordance with an embodiment, the total thickness may include an initial layer thickness in a range of about 5 microns to about 15 microns and a successive layer thickness in a range of about 15 microns to about 50 microns. By re-scanning the additional pattern across the additional metal powder and the initial layer, the scanned additional metal powder adopts the crystallographic orientation of the initial layer to thereby form the successive layer. Because the initial layer has substantially the same crystallographic microstructure as the seed crystal, for directionally solidified applications the successive layer comprises a plurality of grains that are arranged in crystal structures having at least the predetermined primary orientation. In some embodiments, the crystallographic microstructure also may have a predetermined secondary orientation. In single crystal applications, the successive layer comprises a single grain that is arranged in a crystal lattice structure having at least the predetermined primary orientation. In some embodiments, the crystal lattice structure of the successive layer in the single crystal application also may have a predetermined secondary orientation.

Figure 7:
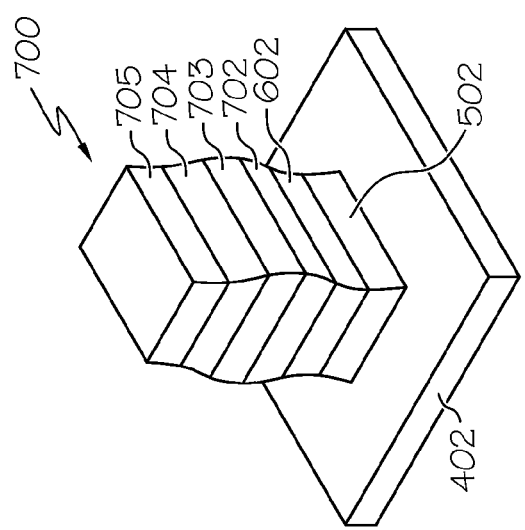

Steps 210 through 214 are repeated until a final shape of a desired resulting component is achieved, step 216. In particular, successive additional layers are deposited, scanned, and re-melted over previously-formed successive layers until the final shape is formed. In embodiments in which each successive layer has only the predetermined primary orientation, the resulting component may have a directionally solidified microstructure. In another embodiment, the resulting component may have a single crystal microstructure. In other embodiments, for single crystal applications with desired secondary orientation control, each successive layer comprises a single grain having the predetermined primary orientation and desired secondary orientation. In any case, each successive layer maintains the same crystallographic orientation of the seed crystal and underlying layers. For example, FIG. 7 illustrates a component formed from a plurality of portions 502, 602, 702, 703, 704, 705 on seed crystal 402, in accordance with an embodiment.

In accordance with an embodiment, the resulting component may be subjected to post-formation processes, step 218. In one embodiment, the post-formation process may include subjecting the resulting component to a heat treatment. The heat treatment may be employed to improve the high temperature creep strength properties of the resulting nickel-base superalloy component. For example, the heat treatment may include a partial gamma prime solution heat treatment step and a gamma-prime precipitation heat treatment step or steps, which may be used to develop a two-phase gamma-gamma prime microstructure. In another example, the heat treatment may include hot isostatic processing to substantially eliminate (e.g., >99%) internal porosity in the component.

In another example of step 218, the resulting component may be subjected to a coating process. In an embodiment, one or more coatings may be formed over the resulting component. The coatings may include bond coatings and/or other types of oxidation-resistant, environmental-resistant or other types of coatings. The coated resulting component may additionally undergo a heat treatment. In another example, the resulting component may undergo a machining process to alter a portion of its outer surface.

Although FIGS. 4-7 illustrate a seed crystal 402 and portions 502, 602, 702, 703, 704, 705 of a component having particular shapes and relative thicknesses, it is to be understood that the seed crystal and component portions may be differently shaped. In addition, although component 700 is shown to have six portions 502, 602, 702, 703, 704, 705, a component may have fewer or more portions (e.g., up to thousands of portions). Embodiments may be used to form, for example, airfoils, blades, nozzles, and other turbine engine components.

In any event, by providing a seed crystal (e.g., seed crystal 402 of FIG. 4) to define a particular predetermined primary orientation and, in some cases, a predetermined secondary orientation, and by employing the novel scanning and re-melting steps described above, components having single crystal and/or directionally solidified microstructures can now be formed using a direct laser metal sintering and melting system. Additionally, the improved fabrication methods may be relatively less expensive and simpler to perform as compared to conventional methods. Moreover, the fabrication method may be employed to form many different components. Specifically, although the inventive subject matter is, for convenience of explanation, depicted and described as being implemented to manufacture components for gas turbine engine, the inventive subject matter can be implemented to manufacture components for various other types of systems that include components comprising single crystal or directionally solidified structures.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A method of fabricating a component having a directionally solidified microstructure or a single crystal microstructure, the method comprising the steps of:
   depositing metal powder over a seed crystal including depositing the metal powder around the seed crystal, the seed crystal having a predetermined primary orientation;
   scanning an initial pattern into the deposited metal powder with a laser beam to at least partially melt or sinter at least a portion of the deposited metal powder;
   re-positioning a target surface of the scanned deposited metal powder above a surface of adjacent metal powder that has not been scanned;
   re-scanning the initial pattern with the laser beam to re-melt the scanned deposited metal powder and form an initial layer, the initial layer having the predetermined primary orientation;
   depositing additional metal powder over the initial layer;
   scanning an additional pattern with the laser beam into the deposited additional metal powder to at least partially melt or sinter at least a portion of the deposited additional metal powder;
   re-scanning the additional pattern with the laser beam to re-melt a portion of the initial layer and the scanned deposited additional metal powder to form a successive layer, the successive layer having the predetermined primary orientation; and
   repeating the steps of depositing additional metal powder, scanning the additional pattern, and re-scanning the additional pattern, until a final shape of the component is achieved;
   wherein the step of re-positioning a target surface is performed after the step of scanning the initial pattern and before the step of re-scanning the initial pattern.

2. The method of claim 1, further comprises:
   after the step of scanning the additional pattern, re-positioning a target surface of the scanned deposited additional metal powder above a surface of the deposited additional metal powder that has not been scanned before the step of re-scanning the additional pattern.

3. The method of claim 1, wherein a total thickness of the successive layer is in a range of about 15 microns to about 50 microns.

4. The method of claim 1, wherein a thickness of a layer of the deposited additional metal powder is in a range of about 15 microns to about 30 microns.

5. The method of claim 1, wherein:
   the seed crystal comprises a single crystal superalloy seed and has a predetermined secondary orientation that is orthogonal relative to the predetermined primary orientation; and
   the successive layer comprises a single grain and has the predetermined primary orientation and the predetermined secondary orientation, after the step of re-scanning the additional pattern.

6. The method of claim 1, further comprising the step of subjecting the component to heat treatment.

7. The method of claim 1, further comprising the step of subjecting the component to a solution and precipitation heat treatment to impart a two-phase gamma-gamma prime microstructure to the component.

8. The method of claim 1, further comprising the step of subjecting the component to a hot isostatic processing.

9. The method of claim 1, further comprising the steps of:
   depositing a coating over the component.

10. A method of fabricating a turbine component for an engine, the method comprising the steps of:
    depositing metal powder over a seed crystal including depositing the metal powder around the seed crystal, the seed crystal having a predetermined primary orientation and a predetermined secondary orientation;
    scanning an initial pattern into the deposited metal powder with a laser beam to melt or sinter at least a portion of the deposited metal powder;
    re-positioning a target surface of the scanned deposited metal powder above a surface of the deposited metal powder that has not been scanned;
    re-scanning the initial pattern with the laser beam to re-melt the scanned deposited metal powder and at least a portion of the seed crystal to form an initial layer, the initial layer having the predetermined primary orientation and the predetermined secondary orientation;
    depositing additional metal powder over the initial layer;
    scanning an additional pattern with the laser beam into the deposited additional metal powder to melt or sinter at least a portion of the deposited additional metal powder;
    re-scanning the additional pattern with the laser beam to re-melt a portion of the initial layer and the scanned deposited additional metal powder to form a successive layer, the successive layer having the predetermined primary orientation and the predetermined secondary orientation; and
    repeating the steps of depositing additional metal powder, scanning the additional pattern, and re-scanning the additional pattern, until a final shape of the turbine component is achieved;
    wherein the step of re-positioning a target surface is performed after the step of scanning the initial pattern and before the step of re-scanning the initial pattern.

11. The method of claim 10, further comprises:
    after the step of scanning the additional pattern, re-positioning a target surface of the scanned deposited additional metal powder above a surface of the deposited additional metal powder that has not been scanned before the step of re-scanning the additional pattern.

* * * * *